(12) United States Patent
Van Brocklin et al.

(10) Patent No.: US 7,286,120 B2
(45) Date of Patent: Oct. 23, 2007

(54) LARGE AREA DISPLAY AND METHOD OF MANUFACTURING SAME

(75) Inventors: Andrew L. Van Brocklin, Corvallis, OR (US); Daryl E. Anderson, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 531 days.

(21) Appl. No.: 10/712,229

(22) Filed: Nov. 12, 2003

(65) Prior Publication Data
US 2005/0099411 A1 May 12, 2005

(51) Int. Cl.
*G09G 5/00* (2006.01)
(52) U.S. Cl. ............... 345/204; 345/205; 345/206; 345/211; 345/212
(58) Field of Classification Search .......... 345/204, 345/107, 55, 74, 77, 80, 205, 206, 211, 212, 345/214, 36, 1.1, 76, 43, 213; 385/4; 349/15, 349/27, 42, 115, 129; 348/47, 56, 46; 313/498, 313/503; 341/115; 315/169.1
See application file for complete search history.

(56) References Cited

U.S. PATENT DOCUMENTS

| | | | | |
|---|---|---|---|---|
| 5,021,775 A | * | 6/1991 | Babin | 345/213 |
| 5,113,181 A | * | 5/1992 | Inoue et al. | 345/84 |
| 5,235,451 A | | 8/1993 | Bryan | |
| 5,396,304 A | * | 3/1995 | Salerno et al. | 353/122 |
| 5,444,557 A | * | 8/1995 | Spitzer et al. | 349/42 |
| 5,514,618 A | | 5/1996 | Hunter, Jr. et al. | |
| 5,539,550 A | * | 7/1996 | Spitzer et al. | 349/42 |
| 5,585,695 A | | 12/1996 | Kitai | |
| 5,644,327 A | | 7/1997 | Onyskevych et al. | |
| 5,861,931 A | * | 1/1999 | Gillian et al. | 349/129 |
| 5,952,948 A | | 9/1999 | Proebsting | |
| 5,956,104 A | * | 9/1999 | Hayashi et al. | 349/42 |
| 5,986,737 A | | 11/1999 | Evanicky et al. | |
| 6,147,724 A | * | 11/2000 | Yoshii et al. | 349/62 |
| 6,194,837 B1 | | 2/2001 | Ozawa | |
| 6,232,937 B1 | | 5/2001 | Jacobsen et al. | |
| 6,268,842 B1 | | 7/2001 | Yamazaki et al. | |
| 6,300,988 B1 | | 10/2001 | Ishihara et al. | |
| 6,359,606 B1 | | 3/2002 | Yudasaka | |
| 6,359,666 B1 | * | 3/2002 | Hayashi et al. | 349/43 |
| 6,364,450 B1 | | 4/2002 | Yamaguchi et al. | |
| 6,373,408 B1 | * | 4/2002 | Kimura et al. | 341/59 |
| 6,426,595 B1 | * | 7/2002 | Odake et al. | 315/169.1 |
| 6,476,988 B1 | | 11/2002 | Yudasaka | |
| 6,498,592 B1 | * | 12/2002 | Matthies | 345/1.1 |
| 6,522,794 B1 | * | 2/2003 | Bischel et al. | 385/4 |

(Continued)

FOREIGN PATENT DOCUMENTS

DE 19950839 5/2001

(Continued)

OTHER PUBLICATIONS

European Search Report dated Mar. 23, 2005.

(Continued)

*Primary Examiner*—Prabodh Dharia

(57) ABSTRACT

An embodiment of a large area display according to the present invention may include a pixel layer including display elements, a connection layer, drivers in communication with the pixel layer and the connection layer, the drivers configured for driving pixels in the pixel layer and configured for communicating through the connection layer. The embodiment of a large area display may further comprise a laminate formed of the pixel layer, the connection layer and drivers. Other embodiments of the present invention include a method and apparatus for manufacturing a large area display.

13 Claims, 4 Drawing Sheets

U.S. PATENT DOCUMENTS

| | | | |
|---|---|---|---|
| 6,525,467 B1 | 2/2003 | Eida et al. | |
| 6,525,788 B1 | 2/2003 | Nakagawa et al. | |
| 6,538,390 B2 | 3/2003 | Fujita et al. | |
| 6,552,704 B1 | 4/2003 | Zavracky et al. | |
| 6,831,678 B1* | 12/2004 | Travis | 348/46 |
| 6,856,086 B2* | 2/2005 | Grace et al. | 313/498 |
| 6,881,946 B2* | 4/2005 | Cok et al. | 250/208.6 |
| 6,897,855 B1* | 5/2005 | Matthies et al. | 345/204 |
| 6,924,601 B2* | 8/2005 | Date | 315/169.1 |
| 6,995,758 B2* | 2/2006 | Fukuda | 345/205 |
| 2002/0044142 A1* | 4/2002 | Fukuda | 345/204 |
| 2002/0053881 A1* | 5/2002 | Odake et al. | 315/169.1 |
| 2002/0195928 A1* | 12/2002 | Grace et al. | 313/503 |
| 2004/0095309 A1* | 5/2004 | Vincent et al. | 345/107 |
| 2004/0095531 A1* | 5/2004 | Jiang et al. | 349/115 |
| 2005/0007336 A1* | 1/2005 | Albert et al. | 345/107 |
| 2005/0078104 A1* | 4/2005 | Matthies et al. | 345/204 |
| 2005/0134554 A1* | 6/2005 | Albert et al. | 345/107 |
| 2005/0243415 A1* | 11/2005 | Lowe et al. | 359/443 |

FOREIGN PATENT DOCUMENTS

| | | |
|---|---|---|
| WO | WO02/47310 | 6/2002 |
| WO | WO03/091798 | 11/2003 |

OTHER PUBLICATIONS

Breakthrough Proprietary Semiconductor Technologies; www.iowathinfilm.com/technology/index.html; taken from referenced cite Oct. 6, 2003.

Philips Demonstrates Video-speed Electronic-paper Technology Based on Electrowetting; www.sciencedaily.com/releases/2003/09/030926070504.htm; taken from referenced cite Oct. 6, 2003.

Sharp 7'LCD Glass integrates Drivers, Controller; http://neasia.nikkeibp.com/nea/200103/peri_124539.html; taken from referenced cite Oct. 22, 2003.

Sharp, SEL integrate processor into system-on-glass device; www.eetimes.com/at/new s/OEG20021023S0048; taken from referenced cite Oct. 22, 2003.

Low—Temperature Polysilicon; www.electroline.com/au/elc/feature_article/item_052002b.asp; taken from referenced cite Oct. 22, 2003.

What is Electronic Ink? www.eink.com; taken from referenced cite Oct. 6, 2003.

Huq, et al; An Overview of LVDS Technology; National Semiconductor Application Note 971; Jul. 1998.

R.C. Liang; Microcup Electrophoretic and Liquid Crystal Displays; SiPix Imaging, Inc.

Greenfield, et al. A Lamination Study of a Composite LCD Flat Panel Display; International Society Conference on Thermal Phenomena; 2002.

Neuburger, et al.; A New Interlayer Interconnect Technology for Multilayer Fabrication; International Conference of Multichip Modules and High Density Packaging; 1998.

Jung, et al.; Chip-in-Polymer: Volumetric Packaging Solution using PCB Technology; SEMI Technology Symposium: International Electronics Manufacturing Technology (IEMT) Symposium; 2002.

* cited by examiner

LARGE AREA DISPLAY AND METHOD OF MANUFACTURING SAME

BACKGROUND OF THE INVENTION

Displays for video and computer monitors are well known in the art. Older display technologies, such at the cathode ray tube (CRT) displays, are being supplanted with newer technologies such as liquid crystal display (LCD) technology, electroluminescent (EL) display technology, and gas plasma display technology. These newer display technologies are useful in applications that require lighter weight, low power and thin displays relative to CRT display technology.

LCD display devices, for example, typically include a pair of glass substrates or "half-cells" overlying one another with liquid crystal material confined between the glass substrates. The substrates are sealed at their periphery to form the cell or LCD. Transparent electrodes are typically applied to the interior surface of the substrates to allow the application of an electric field at various points on the substrates. These various points may form addressable pixel areas on the display.

Note that conventional row and column cross point displays have difficulty when the array size reaches a certain limit. This is because the resistance of the rows and columns and parasitic capacitance combine to slow the driving speed down to an unusable point as the display becomes larger. It is desirable to be able to manufacture large area displays for use with portable devices such as laptop, notebook and tablet computers and personal digital assistants, as well as for much larger applications such as wall mounted displays. Accordingly, there exists a need in the art for large area display and method of manufacturing same.

SUMMARY OF THE INVENTION

An embodiment of a large area display according to the present invention may include a pixel layer including display elements, a connection layer, drivers in communication with the pixel layer and the connection layer, the drivers configured for driving pixels in the pixel layer and configured for communicating through the connection layer. The embodiment of a large area display may further comprise a laminate formed of the pixel layer, the connection layer and drivers.

Additional features and advantages of the invention will be apparent from the detailed description which follows, taken in conjunction with the accompanying drawings, which together illustrate, by way of example, features of embodiments of the present invention.

BRIEF DESCRIPTION OF THE DRAWINGS

The following drawings illustrate exemplary embodiments for carrying out the invention. Like reference numerals refer to like parts in different views or embodiments of the present invention in the drawings.

DETAILED DESCRIPTION

Figure 1:
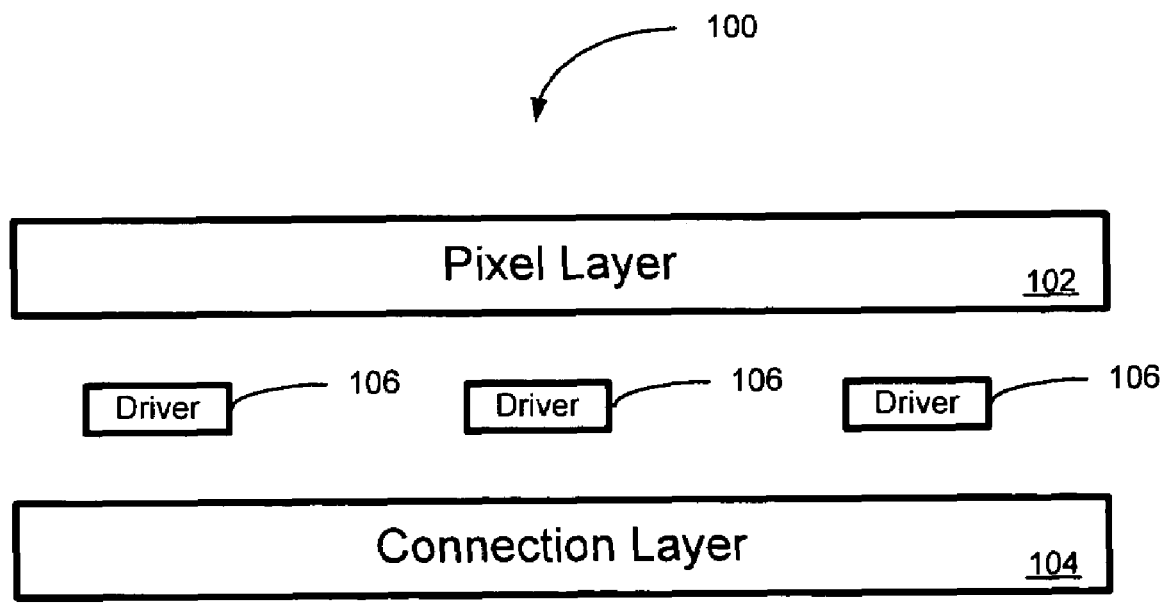
FIG. 1 is a side view of components of a large area display prior to assembly according to an embodiment of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

FIG. 1 is a side view of components of a large area display 100 prior to assembly according to an embodiment of the present invention. An embodiment of a large area display 100 may include a pixel layer 102, a connection layer 104 and drivers 106 (three drivers 106 are shown in FIG. 1) in communication with the pixel layer 102 and the connection layer 104. The drivers 106 may be configured for driving pixels in the pixel layer 102 and configured for communicating through the connection layer 104. Large area display 100 may further include a laminate formed of the pixel layer 102, the connection layer 104 and drivers 106 according to an embodiment of the present invention.

According to another embodiment of the large area display 100 the drivers 106 are laminated between the pixel layer 102 and the connection layer 104. Drivers 106 are in communication with the pixel layer 102 and the connection layer 104 after the components shown in FIG. 1 are assembled. Connection layer 104 may include a first conductive layer for providing power and ground connections to electronics associated with drivers 106 and a second conductive layer for providing serial data connectivity to an input/output (I/O) connector. Thus, connection layer 104 may be used to route power and communicate display data. A method 300 and apparatus 400 for assembling a large area display are detailed below with reference to FIGS. 3 and 4.

Pixel layer 102 may comprise an active matrix display or a passive matrix display. Pixel layer 102 may have a repeating pattern of at least one sub-display 202 (see FIG. 2 and related discussion below) according to embodiments of the present invention. Each sub-display 202 may include an array of display elements, also referred to herein as "pixels," viewable by a user of the large area display 100. The display elements emit light visible to a user of the large area display. The display elements of pixel layer 102 may comprise any suitable display technology including, but not limited to LCD, light emitting diode (LED), organic LED (OLED), polymer light emitting device (PLED), EL, electrophoretic display, electrochromic display, electrowetting, gas plasma and fiber plasma. Such display technologies are within the knowledge of one of ordinary skill in the art in possession of this disclosure and, thus, will not be further elaborated on herein.

It will be understood that for certain types of display technologies no "control element" is needed. A control element may be a transistor, a diode or other active device for switching one or more display elements. Pixel layer 102 may further include a matrix of row and column signal lines having control elements at intersections of the row and column signal lines for driving pixels according to an embodiment of the invention. Pixel layer 102 may include one or more control elements per pixel. A control element may comprise a thin film transistor (TFT), metal insulator metal (MIM) device, or diode according to embodiments of the present invention. According to another embodiment of the present invention the control element may be a part of the display element as in a fiber plasma display. The row and column signals may be connected by a fan out pattern of signal lines (see 208 in FIG. 2 and related discussion below) from pads on an inner surface of pixel layer 102 configured to mate with a surface of driver 106.

Each driver 106 may be configured to drive the pixels of a sub-display 202. Multiple drivers 106 may be arranged in a two-dimensional array of sub-displays 202 to form the large area display 100. Drivers 106 may comprise complementary transistors, according to embodiments of the present invention. Complementary transistors may include, for example and not by way of limitation, complementary metal oxide semiconductor (CMOS) circuitry, p- and n-channel amorphous or polycrystalline silicon or n-channel organic semiconductor paired with p-channel polycrystalline silicon. According to another embodiment of the invention, the CMOS circuitry may be formed on single crystal silicon. Drivers 106 may include serial data input for receiving display data according to other embodiments of the present invention. Drivers 106 may further include data output for sensing and testing according to yet further embodiments of the present invention.

Electronic circuitry including complementary transistors for driving the pixels on the pixel layer 102 may be formed on rigid silicon or glass substrates or on flexible plastic substrates according to embodiments of the present invention. Of course, techniques for applying CMOS electronics on silicon substrates, e.g., drivers 106, are known to those of ordinary skill in the art. Flexible plastic substrates, e.g., KAPTON® polyimide film, available from DuPont High Performance Materials, Circleville, Ohio, are also suitable substrates for electronic circuitry for drivers 106. Techniques for constructing vias and other interconnect structures in flexible substrates are also known to those of ordinary skill in the art. For example see, Neuberger et al., "A New Interlayer Interconnect Technology for Multilayer Fabrication", 1998 International Conference on Multichip Modules and High Density Packaging, pp. 218-23.

An embodiment of a large area display 100 may further include an input/output (I/O) connector 206 in communication with bus 204 and in turn in communication with the connection layer 104. I/O connector 206 may be configured for external communication with a data source (not shown, see FIG. 2 and related discussion below). I/O connector 206 may be any suitable electrical connector for electrically connecting the large area display 100 to other electrical components, e.g., a video source (not shown). Bus 204 may be used to route display data, sensing and testing signals between the I/O connector 206 and the connection layer 104.

Figure 2:
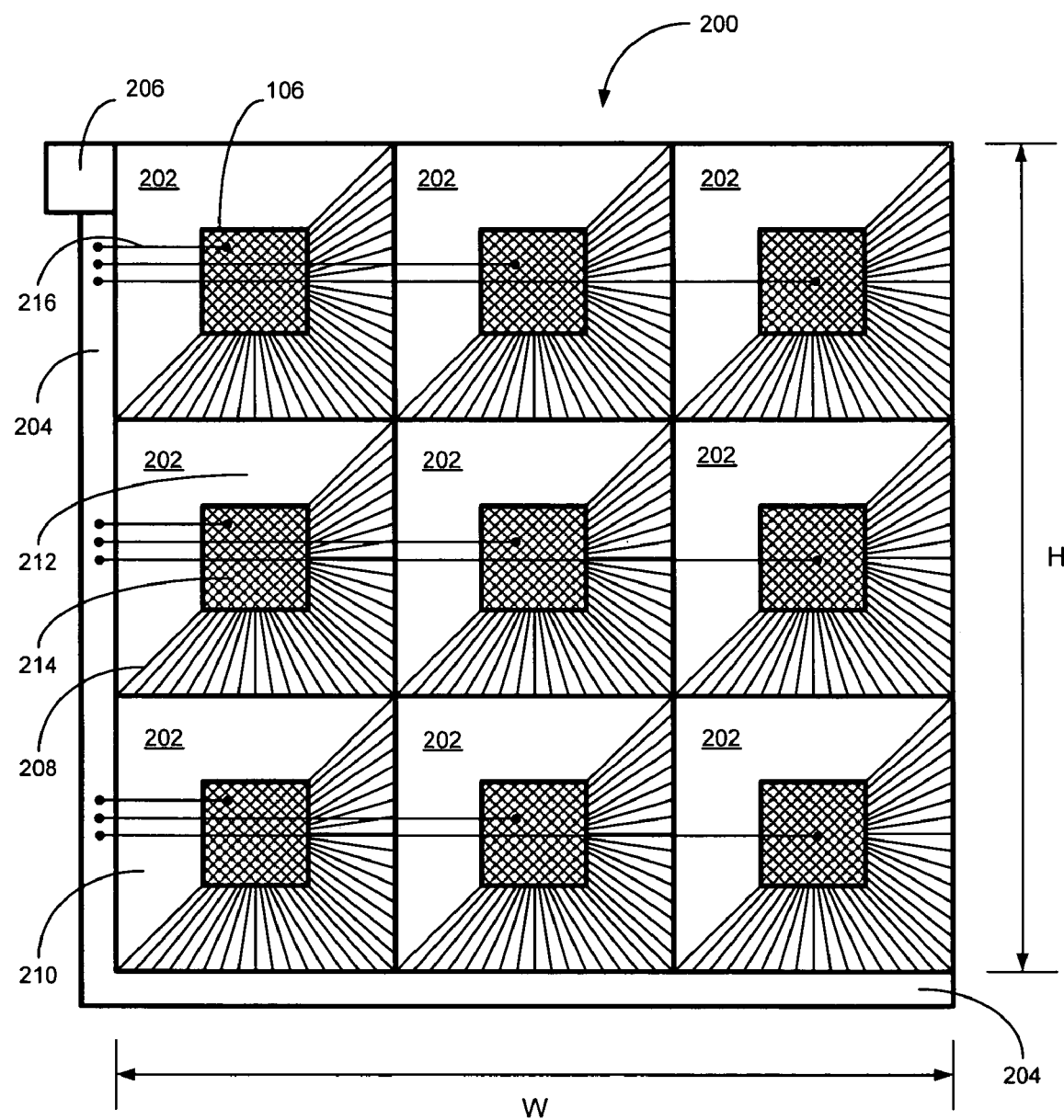
FIG. 2 is a rear view of an embodiment of a large area display according to an embodiment of the present invention.

FIG. 2 is a rear view of an embodiment of a large area display 200 in accordance with the present invention. Large area display 200 may include a plurality of sub-displays 202 (nine sub-displays 202 are shown in FIG. 2). Each of the plurality of sub-displays 202 may include a pixel layer 102 for emitting light, a driver 106 in communication with the pixel layer 102 and configured for driving pixels in the pixel layer 102 and a connection layer 104 in communication with the driver 106 and configured for serial data routing. The plurality of sub-displays 202 may be tiled together to form the large area display 200. Large area display 200 may further include an input/output (I/O) connector 206 in communication with the connection layer 104 of each of the plurality of sub-displays 202 and configured for communication with an external data source (not shown).

As mentioned above, one problem with a conventional large area display with a single driver is the resistance and capacitive loading of row and column lines used to address individual pixels. The resistance and capacitive loading limits the switching speed of the individual display elements. The use of sub-displays 202 in a large area display 200 allows for shorter row and column connections associated with each driver relative to conventional large area displays. Thus, by breaking up regions of a large area display 200 into smaller sub-displays 202, faster switching can be achieved. Additionally, each driver 106 of a sub-display 202 may be smaller in area than the associated pixel layer 102 and connection layer 104 consistent with embodiments of the present invention. Thus, higher production yields and potentially lower costs may be achieved because of the smaller size of the drivers 106.

Connection layer 104 and/or bus 204 and/or I/O connector 206 may include low voltage differential signaling (LVDS) technology for high-speed, low-power data transmission. The two industry standards that define LVDS are ANSI/TIA/EIA-644 and IEEE 1596.3 SCI-LVDS. ANSI/TIA/EIA-644 defines the generic electrical layer of LVDS and IEEE 1596.3 SCI-LVDS is an application specific standard promulgated by the Institute for Electrical and Electronics Engineers (IEEE) titled Scalable Coherent Interface (SCI). LVDS technology utilizes differential logic to transmit data.

It will be readily apparent that the number of sub-displays 202 and particular tiling arrangement used to form a large area display 200 may be arbitrarily chosen for a particular embodiment of the present invention. While the sub-displays 202 shown in FIG. 2 are roughly square in shape, other embodiments of the present invention contemplate arbitrary rectangular shapes of arbitrary size. Thus, a large area display 200 may be sized to virtually any dimension or have any desired aspect ratio (W:H, where W=width and H=height). For example, embodiments of a large area display 200 may have a conventional aspect ratio of 4:3, or a theater aspect ratio of 16:9. Furthermore, a large area display 200 may have an arbitrarily large viewing area. For example, an embodiment of a large area display may be formed of sub-displays 202 each of which having a viewing area of size greater than or equal to about one thousand square centimeters. Other embodiments of a large area display 200 may have a total viewing area of one square meter or more.

Figure 3:
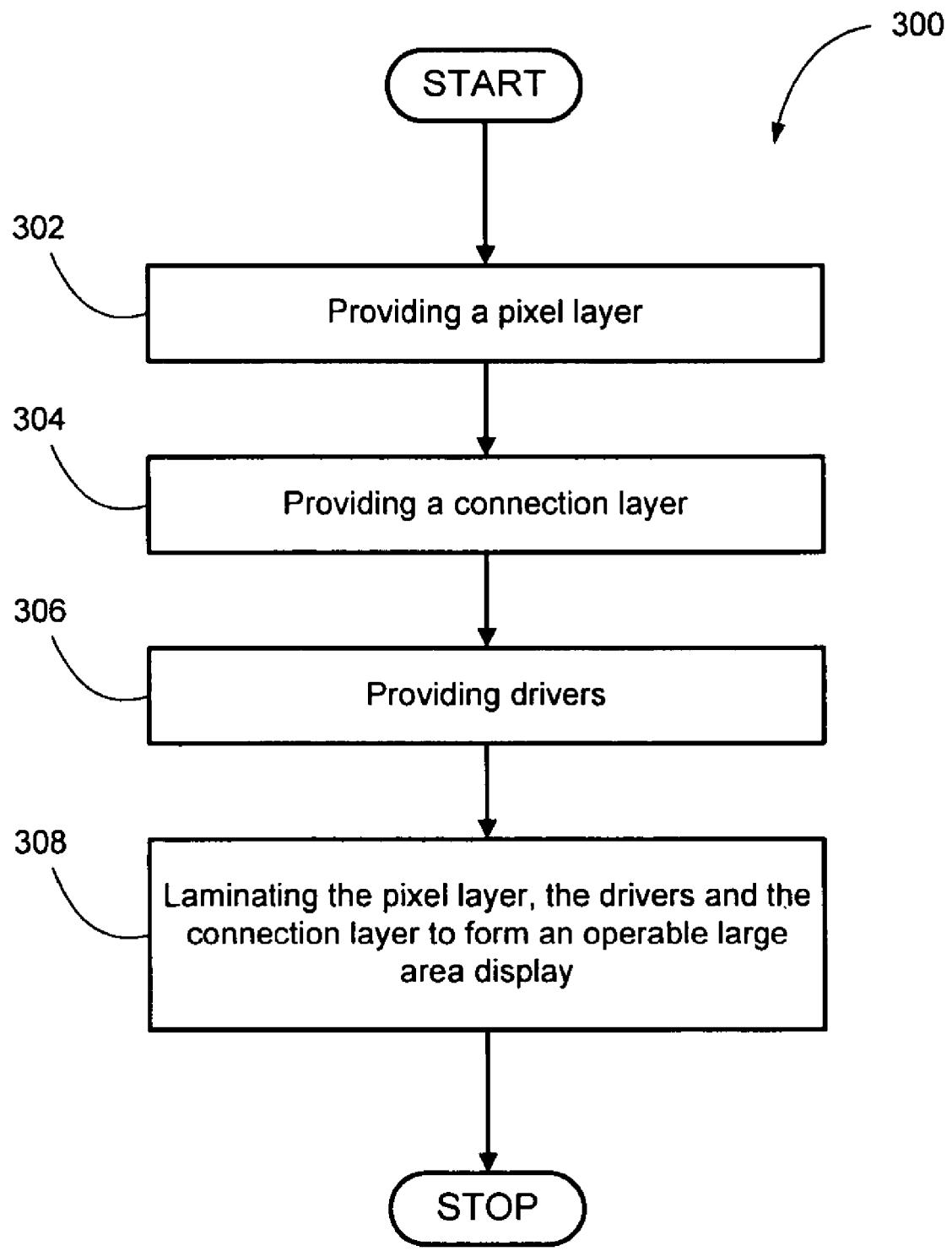
FIG. 3 is a flow chart of a method of manufacturing a large area display according to an embodiment of the present invention.

FIG. 3 is a flow chart of a method 300 of manufacturing a large area display in accordance with an embodiment of the present invention. Method 300 may include providing 302 a pixel layer, providing 304 a connection layer and providing 306 drivers. Method 300 may further include laminating 308 the pixel layer, the drivers and the connection layer to form an operable large area display.

Providing 302 a pixel layer may include providing at least one of a LCD, OLED, EL, PLED, LED, electrophoretic display, electrochromic display, electrowetting, gas plasma, fiber plasma or other suitable display consistent with embodiments of the present invention. Providing 302 a pixel layer may further include providing at least one transistor for each pixel according to another embodiment of the present invention. Each transistor may be a thin film transistor (TFT) according to yet another embodiment of the present invention. Providing 302 a pixel layer may include providing a sheet of enhancement mode organic semiconductor.

Laminating 308 may include laminating the drivers 106 between the pixel 102 and connection layers 104. Techniques and materials for planarizing a large area display having a thickness offset caused by laminates, e.g., drivers 106, are known to those skilled in the art. For example see, Greenfield et al., "A Lamination Study of a Composite LCD Flat Panel Display", 2002 Inter Society Conference on Thermal Phenomena, pp. 1001-06. Techniques for connecting ICs, e.g., a CMOS on silicon embodiment of driver 106, embedded in a multi-layer laminate are also known to those of ordinary skill in the art. For example see, Jung et al., "Chip-in-Polymer: Volumetric Packaging Solution using PCB technology", 2002 SEMI/IEEE IEMT, pp. 46-49.

Figure 4:
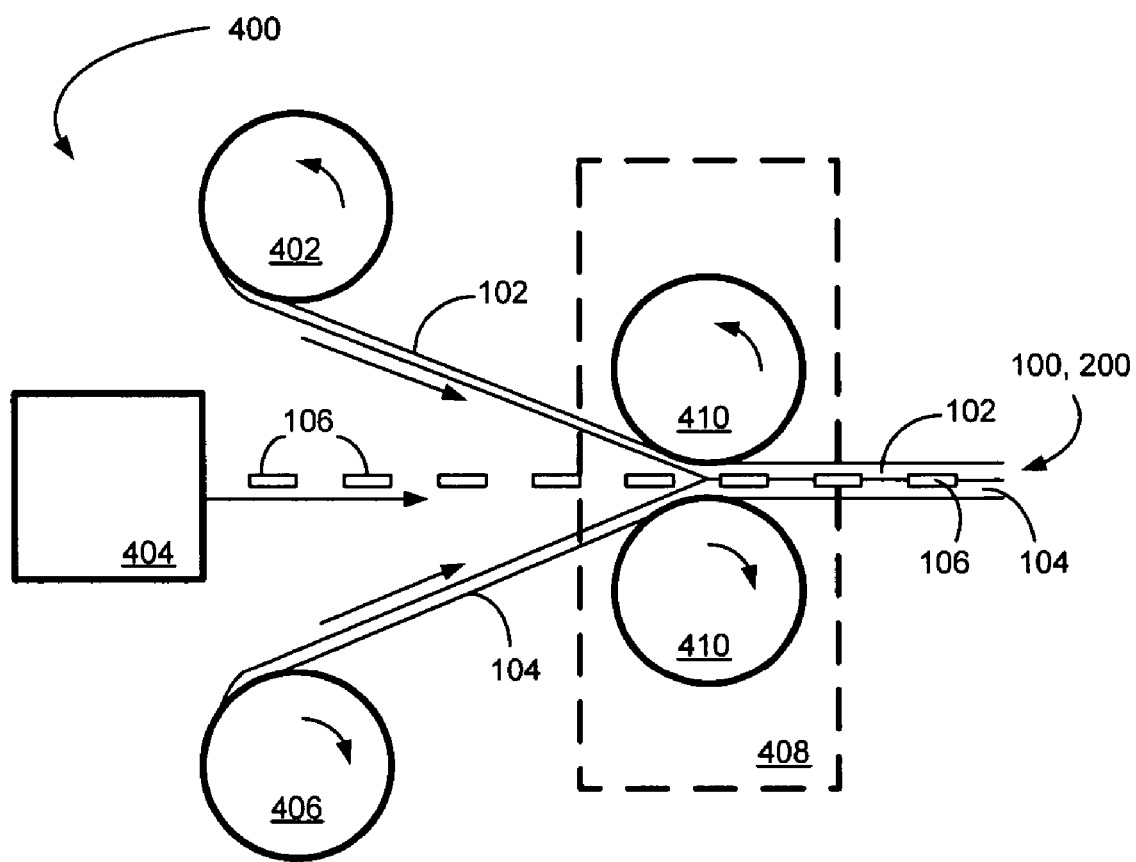
FIG. 4 is diagram of an apparatus for manufacturing a large area display according to an embodiment of the present invention.

FIG. 4 is a diagram of an apparatus 400 for manufacturing a large area display according to an embodiment of the present invention. Apparatus 400 may include a source 402 of a pixel layer 102, a source 404 of drivers 106 and a source 406 of a connection layer 104 according to an embodiment of the present invention. The source 402 of a pixel layer 102 may be roll of pixel layer material preformed or processed through a roll-to-roll manufacturing process according to an embodiment of the present invention. The source 406 of a connection layer 104 may be roll of connection layer material preformed or processed through a roll-to-roll manufacturing process according to an embodiment of the present invention. The source 404 of drivers may be a CMOS fabrication line according to an embodiment of the present invention. The source 404 of drivers 106 may be a pick and place machine with drivers 106 preformed according another embodiment of the present invention.

Apparatus 400 may further include an apparatus 408 for laminating the pixel layer, drivers and connection layer to form an operable large area display according to another embodiment of the present invention. An embodiment of the apparatus 408 for laminating the pixel layer 102, drivers 106 and connection layer 104 to form an operable large area display 100, 200 may include a couple of rollers 410 for pressing together and, thus, laminating the pixel layer 102, drivers 106 and connection layer 104 to form an operable large area display 100, 200, as shown in FIG. 4.

Another embodiment of the apparatus 408 for laminating may include roll-to-roll manufacturing. A description of an exemplary roll-to-roll manufacturing process for producing displays can be found in R. C. Liang, MICROCUP® Electrophoretic and Liquid Crystal Displays by Roll-to-Roll Manufacturing Processes, SiPix Imaging, Inc., 1075 Montague Expressway, Milpitas, Calif., 95035. Roll-to-roll manufacturing techniques are known to one of ordinary skill in the art and, thus will not be further elaborated on herein.

An embodiment of apparatus 400 may further include an apparatus (not shown) for placing features on the pixel layer or the connection layer. The apparatus may comprise an embossing roller with patterning in a roll-to-roll manufacturing process. Roll-to-roll manufacturing allows the sub-displays 202 to be replicated on the pixel layer 102. Patterning of electronics on glass and plastic substrates may also be achieved by using low-temperature polysilicon (LTPS) technology according to an embodiment of the present invention. LTPS technology includes the formation of a thin layer of amorphous silicon layer on the substrate followed by heating to crystallize it as a polysilicon layer. Amorphous silicon crystal growing technology, known as "CG silicon", may also be used to place electronic directly on a glass substrate according to another embodiment of the present invention. Conventional analog, digital and mixed-signal circuitry as needed may then be applied to the polysilicon or CG silicon layer. LTPS and CG silicon technologies are within the knowledge of one of ordinary skill in the art and, thus, will not be further elaborated on herein.

It is to be understood that the above-referenced arrangements are illustrative of the application for the principles of the present invention. Numerous modifications and alternative arrangements can be devised without departing from the spirit and scope of the present invention while the present invention has been shown in the drawings and described above in connection with the exemplary embodiments of the invention. It will be apparent to those of ordinary skill in the art that numerous modifications can be made without departing from the principles and concepts of the invention as set forth in the claims.

What is claimed is:

1. A large area display, comprising:
   a pixel layer having a repeating pattern of sub-displays formed on a continuous pixel layer sheet, the subdisplays including display elements;
   a plurality of drivers, each driver in communication with a corresponding one of the sub-displays and configured for driving the display elements in the sub-display; and
   a connection layer in communication with the drivers having a continuous sheet with conductive traces for distributing power and data to the drivers wherein the pixel layer, the connection layer and the drivers are laminated together to form the large area display.

2. The large area display according to claim 1, wherein the drivers are laminated between the pixel layer and the connection layer.

3. The large area display according to claim 1, wherein the display elements comprises at least one of liquid crystal display (LCD), light emitting diode (LED), organic LED (OLED), polymer light emitting device (PLED), electroluminescent (EL), electrophoretic display, electrochromic display, electrowetting, gas plasma and fiber plasma.

4. The large area display according to claim 1, wherein the pixel layer comprises an active matrix display.

5. The large area display according to claim 1, wherein the pixel layer comprises a passive matrix display.

6. The large area display according to claim 1, wherein the pixel layer comprises at least one transistor per pixel.

7. The large area display according to claim 6, wherein each of the at least one transistors comprises a thin film transistor (TFT).

8. The large area display according to claim 1, wherein the connection layer comprises a first conductive layer for providing power and ground connections to driver electronics and a second conductive layer for providing serial data connectivity to an input/output (I/O) connector.

9. The large area display according to claim 1, wherein the connection layer comprises low voltage differential signaling (LVDS) logic for data transmission.

10. The large area display according to claim 1, wherein the drivers comprise complementary metal on semiconductor (CMOS) circuitry on silicon or glass substrates.

11. The large area display according to claim 1, wherein the drivers comprise complementary metal on semiconductor (CMOS) circuitry on plastic substrates.

12. The large area display according to claim 1, wherein the drivers further comprise:
   serial data input for receiving display data; and
   serial data output for sensing and testing.

13. The large area display according to claim 1, further comprising an input/output (I/O) connector in communication with the connection layer configured for external communication.

* * * * *